(12) United States Patent
Chen et al.

(10) Patent No.: US 8,944,003 B2
(45) Date of Patent: Feb. 3, 2015

(54) REMOTE PLASMA SYSTEM AND METHOD

(71) Applicants: Fei-Fan Chen, Hsinchu (TW); Wen-Sheng Wu, Hsinchu (TW); Chien Kuo Huang, Hsinchu (TW)

(72) Inventors: Fei-Fan Chen, Hsinchu (TW); Wen-Sheng Wu, Hsinchu (TW); Chien Kuo Huang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 112 days.

(21) Appl. No.: 13/679,453

(22) Filed: Nov. 16, 2012

(65) Prior Publication Data

US 2014/0141614 A1     May 22, 2014

(51) Int. Cl.
| | | |
|---|---|---|
| C23C 16/448 | (2006.01) | |
| C23C 16/452 | (2006.01) | |
| C23F 1/00 | (2006.01) | |
| H01L 21/306 | (2006.01) | |
| H01L 21/465 | (2006.01) | |
| H01L 21/02 | (2006.01) | |
| H05H 1/46 | (2006.01) | |
| H01J 37/32 | (2006.01) | |
| C23C 16/06 | (2006.01) | |
| C23C 16/22 | (2006.01) | |

(52) U.S. Cl.
CPC ........ H01L 21/465 (2013.01); H01L 21/02263 (2013.01); H05H 1/46 (2013.01); H01J 37/32357 (2013.01); H01J 37/3244 (2013.01); H01J 37/32477 (2013.01); H05H 2001/4667 (2013.01)
USPC .............. 118/723 I; 118/723 E; 118/723 ER; 118/723 ME; 118/723 MR; 156/345.49; 156/345.35; 156/345.36

(58) Field of Classification Search
USPC ........ 118/723 ME, 723 MR, 723 E, 723 ER, 118/723 I, 723 IR; 156/345.49, 345.35, 156/345.36
See application file for complete search history.

(56) References Cited

U.S. PATENT DOCUMENTS

| | | | | |
|---|---|---|---|---|
| 5,111,111 | A * | 5/1992 | Stevens et al. | 315/111.41 |
| 5,255,286 | A * | 10/1993 | Moslehi et al. | 374/121 |
| 5,290,382 | A * | 3/1994 | Zarowin et al. | 156/345.35 |
| 5,741,070 | A * | 4/1998 | Moslehi | 374/161 |
| 6,150,628 | A * | 11/2000 | Smith et al. | 219/121.54 |
| 6,418,874 | B1 * | 7/2002 | Cox et al. | 118/723 I |
| 6,432,260 | B1 * | 8/2002 | Mahoney et al. | 156/345.35 |
| 6,712,020 | B2 * | 3/2004 | Cox et al. | 118/723 I |
| 6,820,570 | B2 * | 11/2004 | Kilpela et al. | 118/723 R |
| 7,363,876 | B2 * | 4/2008 | Lai et al. | 118/723 I |
| 7,411,148 | B2 * | 8/2008 | Kwon et al. | 219/121.43 |
| 7,501,600 | B2 * | 3/2009 | Holber et al. | 219/121.52 |
| 7,541,558 | B2 * | 6/2009 | Smith et al. | 219/121.41 |

(Continued)

OTHER PUBLICATIONS

"Overview of Alumina," http://www.rci.rutgers.edu/~glock/old/mse/topics/alumina.html, dated at least as early Nov. 11, 2012, 3 pages.

(Continued)

Primary Examiner — Rudy Zervigon
(74) Attorney, Agent, or Firm — Slater & Matsil, L.L.P.

(57) ABSTRACT

A system and method for generating and using plasma is provided. An embodiment comprises a plasma generating unit that comprises beta-phase aluminum oxide. A precursor material is introduced to the plasma generating unit and a plasma is induced from the precursor material. The plasma may be used to deposit or etch materials on a semiconductor substrate.

20 Claims, 2 Drawing Sheets

(56) References Cited

U.S. PATENT DOCUMENTS

| | | | |
|---|---|---|---|
| 7,700,465 B2 * | 4/2010 | Collins et al. | 438/513 |
| 7,981,808 B2 | 7/2011 | Luo et al. | |
| 8,035,056 B2 * | 10/2011 | Kwon et al. | 219/121.43 |
| 8,124,048 B2 * | 2/2012 | Mizuno et al. | 423/630 |
| 8,357,262 B2 * | 1/2013 | Nakahara et al. | 156/345.1 |
| 8,409,400 B2 * | 4/2013 | Wi | 156/345.48 |
| 8,430,962 B2 * | 4/2013 | Masuda | 118/715 |
| 8,652,297 B2 * | 2/2014 | Collins et al. | 156/345.44 |
| 8,679,255 B2 * | 3/2014 | Masuda | 118/715 |
| 8,771,538 B2 * | 7/2014 | Lubomirsky et al. | 216/68 |
| 8,779,322 B2 * | 7/2014 | Holber et al. | 219/121.41 |
| 2002/0157793 A1 * | 10/2002 | Cox et al. | 156/345.48 |
| 2003/0085205 A1 * | 5/2003 | Lai et al. | 219/121.43 |
| 2004/0182517 A1 * | 9/2004 | Lai et al. | 156/345.48 |
| 2004/0226512 A1 * | 11/2004 | Lai et al. | 118/723 I |
| 2005/0051089 A1 * | 3/2005 | Tauchi et al. | 118/715 |
| 2005/0145173 A1 * | 7/2005 | Holber et al. | 118/723 E |
| 2006/0162661 A1 * | 7/2006 | Jung et al. | 118/723 ER |
| 2006/0277897 A1 * | 12/2006 | Slone | 60/286 |
| 2008/0179009 A1 * | 7/2008 | Collins et al. | 156/345.35 |
| 2008/0283499 A1 * | 11/2008 | Nakahara et al. | 216/67 |
| 2009/0017227 A1 * | 1/2009 | Fu et al. | 427/569 |
| 2009/0277874 A1 * | 11/2009 | Rui et al. | 216/67 |
| 2010/0021374 A1 * | 1/2010 | Mizuno et al. | 423/625 |
| 2011/0011338 A1 | 1/2011 | Chuc et al. | |
| 2011/0114601 A1 * | 5/2011 | Lubomirsky et al. | 216/68 |
| 2011/0115378 A1 * | 5/2011 | Lubomirsky et al. | 315/111.21 |
| 2014/0130980 A1 * | 5/2014 | Lee et al. | 156/345.29 |

OTHER PUBLICATIONS

Applied Materials,Inc., "APC Introduction," Mar. 2011, 14 pages.
Arribart et al., "Beta-alumina," Materials of Science & Engineering, Feb. 16, 2001, 2 pages.
Chen, "Flowable-CVD Alectrona Introduction," Applied Materials, Inc. Nov. 20, 2009, 28 pages.

* cited by examiner

REMOTE PLASMA SYSTEM AND METHOD

BACKGROUND

Generally, to form a semiconductor device such as an integrated circuit, a silicon wafer is initially prepared and a series of processes such as etching, depositing, coating, plating, patterning, and the like are performed in order to manufacture structures on the semiconductor wafer as well as forming interconnections between the structures once the structures are formed. These processes may be utilized to form both conductive paths (e.g., form metals and other conductive materials) and non-conductive regions (e.g., form dielectric materials) in order to separate and isolate the conductive paths from each other so that short circuits and other problems do not form during manufacture or operation of the semiconductor device. All of these processes, along with other processes, may be used to finalize the semiconductor device for use by a consumer.

As some of these processes have grown in popularity for the manufacturing of semiconductor devices, extensive research has been performed to find ways to enhance these processes for the ultimate goal of scaling down the semiconductor devices even further. One such enhancement that has been utilized is the use of plasma in deposition and etching processes. The plasma is especially useful in the enhancement of chemical and physical reactions that occur during the deposition and etching processes. For example, the plasma may be used to help initiate chemical reactions, or may be used to control the speed of the desired chemical or physical reactions. By enhancing the reactions, the processes may be made to be more efficient, and by making the overall processes more efficient, the overall process for making the semiconductor device may also be made to be more efficient.

However, the use of plasma in processes such as deposition and etching, while helping in some respects, also creates problems and challenges with its use. These problems need to be addressed to make the use of plasma within these processes even more efficient.

BRIEF DESCRIPTION OF THE DRAWINGS

For a more complete understanding of the present embodiments, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a chemical vapor deposition processing chamber for a 20 μm, 14 μm, or smaller processing node. Other embodiments may also be applied, however, to other plasma assisted processes and devices.

Figure 1:
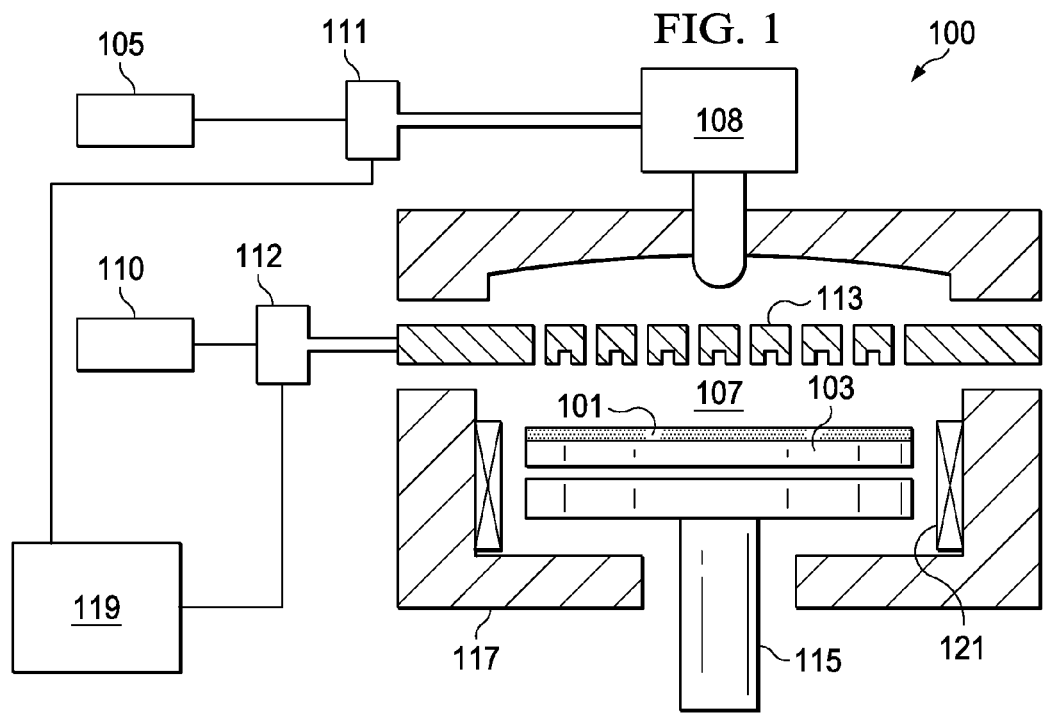
FIG. 1 illustrates a deposition chamber with a plasma generator in accordance with an embodiment.

With reference now to FIG. 1, there is shown a deposition system 100 using remote plasma that may be utilized to form a deposited layer 101 on a substrate 103 in a process such as flowable chemical vapor deposition. However, while the embodiment is described with reference to the deposition system 100, the embodiments are not limited to a deposition process. Rather, any process that utilizes a plasma may benefit from the embodiments, such as plasma assisted etching processes, plasma treatment processes, or the like. All such plasma processes and remote plasma processes are fully intended to be included within the scope of the embodiments.

In an embodiment the deposition system 100 may utilize two or more precursor materials to form the deposited layer 101. For example, the deposition system 100 may receive precursor materials from a first precursor delivery system 105 and a second precursor delivery system 110, to form the deposited layer 101 onto the substrate 103. The formation of the deposited layer 101 may be performed in a deposition chamber 107 which receives the first precursor material and the second precursor material.

The first precursor delivery system 105 and the second precursor delivery system 110 may work in conjunction with one another to supply the various different precursor materials to the deposition chamber 107. In an embodiment in which the first precursor material is in a gaseous state during preparation and storage (e.g., a first precursor material such as ammonia), the first precursor delivery system 105 may comprise a first precursor material supplier, such as a gas storage tank or a machine to generate the first precursor material on an as-needed basis in order to supply it to a plasma block 108 (discussed further below).

Alternatively, in an embodiment where the first precursor material is either a liquid or solid precursor material, the first precursor delivery system 105 may comprise a carrier gas supply (not individually illustrated) and a precursor canister (not individually illustrated) arranged in series. The carrier gas supply may be, e.g., an inert gas and may be used to help "carry" the precursor gas to the plasma block 108 and into the deposition chamber 107 and may be coupled to the precursor canister, which may be utilized to supply a desired precursor (e.g., the first precursor material) to the deposition chamber 107 by vaporizing or sublimating precursor materials that may be delivered in either a solid or liquid phase. The precursor canister may have a vapor region into which precursor material is driven into a gaseous phase so that the carrier gas from the flow controller may enter the precursor canister and pick-up or carry the gaseous precursor material out of the precursor canister and towards the deposition chamber 107.

The first precursor delivery system 105 is connected to and supplies the first precursor material to a first precursor gas controller 111, which may supply the first precursor material to the plasma block 108 before the first precursor material enters the deposition chamber 107. In an embodiment the first precursor gas controller may include such devices as valves, flow meters, sensors, and the like to control the connection and delivery rate of the first precursor material to the plasma block 108. The first precursor gas controller 111 may be controlled and receive instructions from a control unit 119.

The second precursor delivery system 110 may comprise components similar to the first precursor delivery system 105. For example, if the second precursor material is in a gaseous state during preparation and storage, the second precursor delivery system 110 may comprise a second precursor material supplier, such as a gas storage tank or a machine to generate the second precursor material on an as-needed basis. Alternatively, if the second precursor material is in a liquid or solid state during preparation and storage, the second precursor delivery system 110 may be implemented using a carrier gas and a sublimation/vaporization process.

The second precursor delivery system 110 may supply a stream of the second precursor material to, e.g., a second precursor gas controller 112, which may supply the second precursor material to the showerhead 113 without turning it into a plasma as the second precursor material (in a non-plasma phase) enters the deposition chamber 107. In an embodiment the second precursor gas controller 112 may be similar to the first precursor gas controller 111 (discussed above) and may include such devices as valves, flow meters, sensors, and the like to control the connection and delivery rate of the second precursor material to the showerhead 113. The second precursor gas controller 112 may also be controlled and receive instructions from the control unit 119.

The first precursor gas controller 111 and the second precursor gas controller 112, upon receiving instructions from the control unit 119, may open and/or close valves so as to connect the first precursor delivery system 105 and the second precursor delivery system 110 to the plasma block 108 and the deposition chamber 107, respectively, and direct the desired precursor materials to their respective destinations. For example, the first precursor gas controller 111 will direct the first precursor material to the plasma block 108 and the second precursor gas controller 112 will direct the second precursor material to the showerhead 113.

The showerhead 113 may be a dual-zone showerhead utilized to disperse the chosen precursor materials into the deposition chamber 107 and may be designed to evenly disperse the precursor materials in order to minimize undesired process conditions that may arise from uneven dispersal. In an embodiment the showerhead 113 may have a dual dispersion design that accepts both the first precursor material (through, e.g., a first plasma inlet) and the second precursor material (through, e.g., a second inlet) at the same time and will disperse both the first precursor material and the second precursor material in an even distribution around the deposition chamber 107. The showerhead 113 may have a circular design with openings dispersed evenly around the showerhead 113 to allow for the dispersal of the first precursor material and the second precursor material into the deposition chamber 107.

The deposition chamber 107 may receive the desired precursor materials and expose the precursor materials to the substrate 103, and the deposition chamber 107 may be any desired shape that may be suitable for dispersing the precursor materials and contacting the precursor materials with the substrate 103. In the embodiment illustrated in FIG. 1, the deposition chamber 107 has a cylindrical sidewall and a bottom. Furthermore, the deposition chamber 107 may be surrounded by a housing 117 made of material that is inert to the various process materials. In an embodiment, the housing 117 may be steel, stainless steel, nickel, aluminum, alloys of these, or combinations of these.

Within the deposition chamber 107 the substrate 103 may be placed on a mounting platform 115 made of, e.g., aluminum, in order to position and control the substrate 103 during the deposition process. The mounting platform 115 may be rotatable and may include heating mechanisms in order to heat the substrate 103 during the deposition process. Furthermore, while a single mounting platform 115 is illustrated in FIG. 1, any number of mounting platforms 115 may additionally be included within the deposition chamber 107.

The deposition chamber 107 may also have pumping channels 121 for exhaust gases to exit the deposition chamber 107. A vacuum pump (not shown) may be connected to the pumping channels 121 of the deposition chamber 107 in order to help evacuate the exhaust gases. The vacuum pump, under control of the control unit 119, may also be utilized to reduce and control the pressure within the deposition chamber 107 to a desired pressure and may also be utilized to evacuate precursor materials from the deposition chamber 107 in preparation for the introduction of a purge gas.

Figure 2:
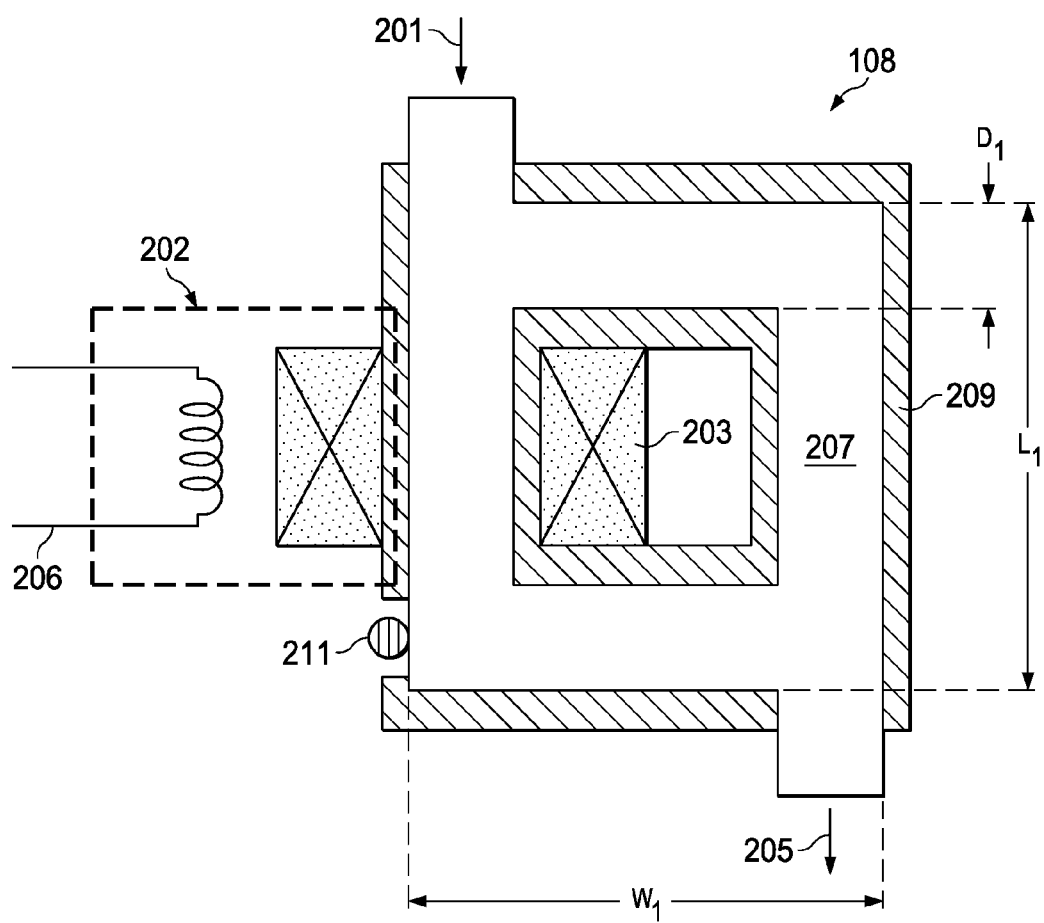
FIG. 2 illustrates a plasma generation unit in accordance with an embodiment.

FIG. 2 illustrates an embodiment of the plasma block 108 (or plasma generator) from FIG. 1 in greater detail. In an embodiment the plasma block 108 has an inlet port 201 that receives the first precursor material from the first precursor gas controller 111 and an outlet port 205 that is coupled to deliver a first precursor plasma (converted from the first precursor material) to the showerhead 113. The first precursor material enters the plasma block 108 and passes between a magnetic core 203 that surrounds a portion of the plasma block 108. The magnetic core 203 is utilized to induce the formation of the first precursor plasma from the first precursor material that enters the plasma block 108 before exiting out of an outlet port 205.

The magnetic core 203 may be situated around a portion of the flow path through the plasma block 108 from the inlet port 201 to the outlet port 205. In an embodiment the magnetic core 203 is one portion of a transformer 202 (illustrated in FIG. 2 with dashed line 202), with a primary coil 206 forming another portion of the transformer 202. In an embodiment the primary coil 206 may have a winding of between about 100 and about 1000 such as about 600.

To generate the desired first precursor plasma from the first precursor material within the plasma block 108, a short, high-voltage pulse of electricity controlled, e.g., by the control unit 119 (see FIG. 1) may be applied to the primary coil 206. The high-voltage pulse of electricity in the primary coil 206 is transformed to a pulse of energy into the magnetic core 203, which induces the formation of the first precursor plasma within the plasma block 108. In an embodiment the high-voltage pulse may be between about 10 KHz and about 2 MHz such as about 1 MHz for a duration of between about 0.01 ms and about 1 s, such as about 10 ms.

However, while igniting the first precursor material with a magnetic coil is described as an embodiment that may be used with the embodiments, the embodiments are not so limited. Rather, any suitable method or structures may be used to ignite the first precursor material to form the first precursor plasma. For example, in alternative embodiments a high voltage pulse may be applied to an electrode (not illustrated) coupled to the plasma block 108, or the first precursor material may be exposed to a ultraviolet radiation that may be used to ignite the first precursor material and form the first precursor plasma. Any suitable method of igniting the first precursor material and any other suitable plasma inducing device are fully intended to be included within the scope of the embodiments.

The plasma block 108 comprises a circular path between the inlet port 201 and the outlet port 205 in which the first precursor material may travel. In an embodiment the circular path may have a first length $L_1$ of between about 100 mm and about 500 mm, such as about 250 mm, and a first width $W_1$ of between about 100 mm and about 500 mm such as about 250 mm. Similarly, the interior of the circular path through the plasma block may have a first diameter $D_1$ of between about 20 mm and about 150 mm, such as about 70 mm. However, any other suitable structure or shape may alternatively be utilized.

The plasma block 108 also comprises an inner housing 207 and an insulator 209 surrounding the inner housing 207. The insulator 209 may be used to electrically and thermally isolate the inner housing 207 of the plasma block 108. In an embodiment the inner housing 207 encloses and encapsulates the circular path of the first precursor material and (after ignition) the first precursor plasma in order to guide the first precursor material and the first precursor plasma through the plasma block 108.

The inner housing 207 of the plasma block 108 is made from a material that is resistant to the deleterious effects of exposure to the first precursor plasma created by the plasma block 108. For example, the inner housing 207 of the plasma block 108 is a material such as beta-phase aluminum oxide. In a particular embodiment the inner housing 207 of the plasma block 108 may comprise a beta-phase aluminum oxide in which sodium ions are incorporated into the crystalline lattice of the aluminum oxide by occupying scarcely occupied planes between thin layers of dense alumina. For example, the beta-phase aluminum oxide may be beta-alumina ($11Al_2O_3$-$xNa_2O$), where x is between 1.0 and 1.6, such as being between 1.25 and 1.4, or beta-double prime alumina ($Na_2O.5Al_2O_3$), although any other suitable beta phase aluminum oxide may alternatively be utilized.

By utilizing a beta-phase aluminum oxide, the inner housing 207 of the plasma block 108 is stronger, more reliable, and more resistant to deterioration from exposure to the various plasmas that are generated within the plasma block 108. By having less deterioration, there is a reduced likelihood that plasma pollution caused by such deterioration will occur, leading to a cleaner, more efficient plasma generation process. This allows for a broader processing window, a more reliable process performance, and an improved yield from defects. Additionally, by being more resistant to deterioration, maintenance is not needed as often, leading to lower maintenance costs and less downtime for the deposition system 100.

The inner housing 207 of the plasma block 108 may be formed using any suitable method for forming and shaping beta-phase aluminum oxide into the desired shape for the plasma block 108. In an embodiment the inner housing 207 may be formed by casting the beta-phase aluminum oxide into the shape of the inner housing 207. However, other suitable forming and shaping techniques, such as milling or other physical removal processes, may alternatively be utilized.

The plasma block 108 may also comprise a sensor 211 that may be used to measure the conditions within the plasma block 108. In an embodiment the sensor 211 may be a current probe used to measure the current and power of the plasma as part of a feedback loop to the control unit 119 (see FIG. 1). In addition, or alternatively, the sensor 211 may also comprise an optical sensor or any other measurement devices that may be used to measure and control the plasma generation within the plasma block 108.

Returning to FIG. 1, the formation of the deposited layer 101 may be initiated by putting a first precursor into the first precursor delivery system 105. For example, in an embodiment in which the deposited layer 101 is a dielectric layer such as silicon nitride, the first precursor material may be a precursor such as ammonia ($NH_3$). Alternatively, any other suitable precursor material in any suitable phase (solid, liquid, or gas) to form a layer of silicon nitride, such as nitrogen ($N_2$), $NH_4OH$, $NO$, $N_2O$, $NO_2$, combinations thereof, or the like, may alternatively be utilized, and any other precursor that may be transformed into a plasma for use in the deposition of any other materials may also alternatively be utilized.

Additionally, the second precursor material may be placed into or formed by the second precursor delivery system 110. In the embodiment in which a layer of silicon nitride is desired for the deposited layer 101 and the first precursor material is ammonia, the second precursor material may be a silicon containing second precursor material. For example, in the embodiment in which ammonia is utilized as the first precursor material, trisillylamine (TSA) may be used as the second precursor material and may be placed into the second precursor delivery system 110. Alternatively, any other suitable precursor material, such as disillylamine or other sillylamines, or combinations of these, may be utilized as the second precursor material.

However, as one of ordinary skill in the art will recognize, the above described precursor materials used to form a layer of silicon nitride are not the only precursor materials that may be used. Rather, any materials or combination of materials may alternatively be utilized to form a layer of silicon nitride, and other precursors or combination of precursors may alternatively be utilized to form other conductive and dielectric layers on the substrate 103. All such precursor combinations are fully intended to be included within the scope of the embodiments.

Once the first precursor material and the second precursor material are ready in the first precursor delivery system 105 and the second precursor delivery system 110, respectively, the formation of the deposited layer 101 may be initiated by the control unit 119 sending an instruction to the first precursor gas controller 111 and the second precursor gas controller 112 to connect the first precursor delivery system 105 and the second precursor delivery system 110 to the deposition chamber 107. Once connected, the first precursor delivery system 105 can deliver the first precursor material (e.g., ammonia) to the showerhead 113 through the plasma block 108, with the plasma block 108 inducing the formation of the first precursor plasma as the first precursor material passes through the plasma block 108. The showerhead 113 can then disperse the first precursor plasma into the deposition chamber 107, wherein the first precursor plasma can be adsorbed and react to the exposed surface of the substrate 103.

In the embodiment in which the deposited layer 101 is silicon nitride formed with ammonia and TSA, the first precursor material may be flowed into the plasma block 108 at a flow rate of between about 1 sccm and about 2000 sccm, such as about 1000 sccm. Additionally, the deposition chamber 107 may be held at a pressure of between about 0.1 torr and about 10 torr, such as about 5 torr, and a temperature of between about 100° C. and about 500° C., such as about 250° C. However, as one of ordinary skill in the art will recognize, these process conditions are only intended to be illustrative, as any suitable process conditions may be utilized while remaining within the scope of the embodiments.

Optionally, a noble gas such as argon may be added to the first precursor material before the first precursor material enters the plasma block 108. Such an introduction of a noble gas helps with the ignition of the first precursor material by lowering the voltage required to ignite the first precursor material into the first precursor plasma.

At the same time, the introduction of the second precursor material (e.g., TSA) to the deposition chamber 107 may be initiated by the control unit 119 sending an instruction to the second precursor gas controller 112 to connect the second precursor delivery system 110 (supplying the second precursor material) to the deposition chamber 107. Once connected, the second precursor delivery system 110 can deliver the second precursor material to the showerhead 113 at the same time, before, or after the first precursor plasma. The showerhead 113 can then disperse the second precursor material into the deposition chamber 107, wherein the second precursor material can react with the first precursor material to form the desired deposited layer 101 on the substrate 103.

In the embodiment discussed above to form a layer of silicon nitride with ammonia and TSA, the TSA may be introduced into the deposition chamber 107 at a flow rate of between about 10 sccm and about 2000 sccm, such as about 1000 sccm. However, as one of ordinary skill in the art will recognize, these process conditions are only intended to be illustrative, as any suitable process conditions may be utilized to introduce oxygen while remaining within the scope of the embodiments.

Figure 3:
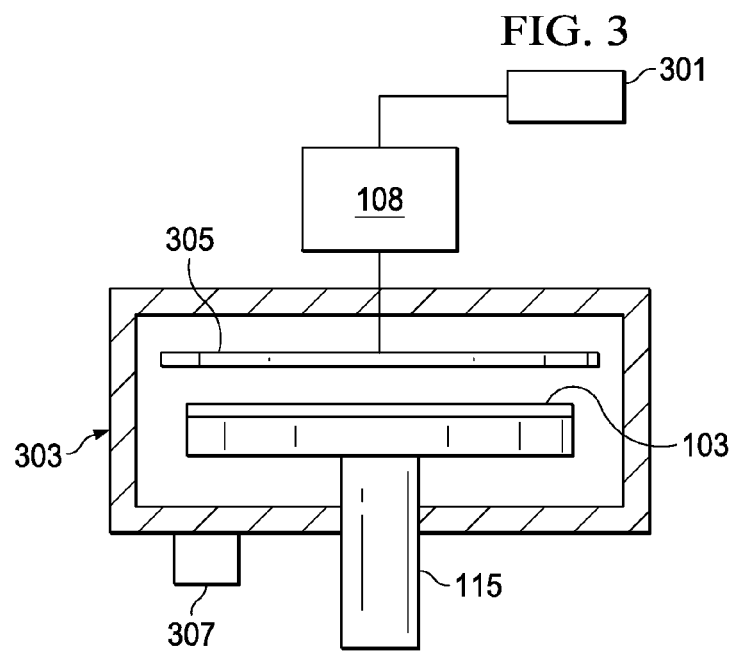
FIG. 3 illustrates a plasma generation unit in an etching process in accordance with an embodiment.

FIG. 3 illustrates an alternative embodiment which may utilize the plasma block 108 in a physical vapor deposition Aktiv preclean process. In this embodiment, rather than a deposition process using the deposition chamber 107, the pre-clean process that utilizes plasma is illustrated. In this embodiment a cleaning material such as hydrogen gas is loaded into a third delivery system 301, although any suitable cleaning material may alternatively be utilized. Optionally, a diluent gas such as helium may be mixed with the cleaning material. The third delivery system 301 may be similar to the first precursor delivery system 105 and the second precursor delivery system 110 (discussed above with respect to FIG. 1) but may alternatively be different.

The third delivery system 301 may deliver the cleaning material to the plasma block 108. The plasma block 108, made from beta-phase aluminum oxide, may be utilized to ignite the cleaning material (e.g., hydrogen gas or fluorine gas) into a cleaning plasma and dissociate the cleaning material into its respective ions. The use of beta-phase aluminum oxide helps to protect the plasma block 108 and reduce the maintenance of the plasma block 108.

Once the plasma block 108 has ignited the cleaning material into a cleaning plasma, the plasma block 108 may deliver the cleaning plasma into a cleaning chamber 303, where the substrate 103 rests on the mounting platform 115. The plasma block 108 may deliver the cleaning plasma to a second showerhead 305 within the cleaning chamber 303. In this embodiment the second showerhead 305 may be shaped to evenly distribute the cleaning plasma throughout the cleaning chamber 303 and to evenly distribute the cleaning plasma along a surface of the substrate 103. The second showerhead 305 may have a circular design with openings dispersed evenly around the second showerhead 305. Process conditions such as pressure within the cleaning chamber 303 may be controlled by a pump 307.

By utilizing the plasma block 108 to generate the plasma, such cleaning can produce an efficient removal of any residues, such as polymeric residues or metallix oxides (e.g., CuO), that may build up on the substrate 103 during other processing steps. However, the use of a remote plasma system provides the plasma without exposing the substrate 103 directly to the plasma, helping to protect such materials as porous SiCOH.

In accordance with an embodiment, a remote plasma system comprising an inlet port is provided. An inner housing is coupled to the inlet port to generate a plasma, the inner housing comprising beta-phase aluminum oxide, and an outlet port is coupled to the inner housing.

In accordance with another embodiment, a remote plasma system comprising a semiconductor processing chamber is provided. A showerhead is within the semiconductor processing chamber, the showerhead comprising a plasma inlet to receive a plasma precursor, and a plasma generator is coupled to the plasma inlet, the plasma generator comprising a plasma inducing device and a inner housing, the inner housing comprising sodium, aluminum, and oxygen atoms.

In accordance with yet another embodiment, a method of manufacturing semiconductor devices comprising introducing a first precursor material into a plasma generation unit, the plasma generation unit comprising beta-phase aluminum oxide is provided. A plasma is induced from the first precursor material, and the plasma is introduced to a semiconductor manufacturing chamber.

Although the present embodiments and their advantages have been described in detail, it should be understood that various changes, substitutions and alterations can be made herein without departing from the spirit and scope of the disclosure as defined by the appended claims. For example, the materials and processes described herein are intended for illustrative purposes only, as the precursor materials may be modified. Additionally, the embodiments may be used in a variety of plasma processes, such as deposition, etching, cleaning, and other plasma operations.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A remote plasma system comprising:
   an inlet port;
   an inner housing coupled to the inlet port to generate a plasma, the inner housing comprising beta-phase aluminum oxide; and
   an outlet port coupled to the inner housing.

2. The remote plasma system of claim 1, further comprising a deposition chamber coupled to the outlet port.

3. The remote plasma system of claim 2, wherein the deposition chamber further comprises a showerhead coupled to the outlet port.

4. The remote plasma system of claim 3, wherein the showerhead is a dual showerhead, and wherein the dual showerhead is also coupled to a non-plasma precursor delivery system.

5. The remote plasma system of claim 1, further comprising an etching chamber coupled to the outlet port.

6. The remote plasma system of claim 1, further comprising a magnetic coil around a portion of the inner housing.

7. The remote plasma system of claim 1, wherein the inner housing comprises beta-double aluminum oxide.

8. A remote plasma system comprising:
   a semiconductor processing chamber;
   a showerhead within the semiconductor processing chamber, the showerhead comprising a plasma inlet to receive a plasma precursor; and
   a plasma generator coupled to the plasma inlet, the plasma generator comprising a plasma inducing device and an inner housing, the inner housing comprising sodium, aluminum, and oxygen atoms.

9. The remote plasma system of claim 8, wherein the semiconductor processing chamber is a deposition chamber.

10. The remote plasma system of claim 8, wherein the semiconductor processing chamber is an etching chamber.

11. The remote plasma system of claim 8, wherein the plasma inducing device is a magnetic coil.

12. The remote plasma system of claim 8, wherein the inner housing comprises beta-double aluminum oxide.

13. The remote plasma system of claim 8, wherein the showerhead is a double showerhead that is also coupled to a non-plasma precursor source.

14. The remote plasma system of claim 8, wherein the plasma generator further comprises a loop between an inlet and an outlet.

15. A remote plasma system comprising:
   a plasma generating unit comprising:
      a plasma generating region; and
      a housing around the plasma generating region, the housing comprising a beta-phase aluminum oxide; and
   a showerhead connected to the plasma generating unit.

16. The remote plasma system of claim 15, further comprising a semiconductor processing chamber, wherein the showerhead is located within the semiconductor processing chamber.

17. The remote plasma system of claim 16, wherein the semiconductor processing chamber is a deposition chamber.

18. The remote plasma system of claim 16, wherein the semiconductor processing chamber is an etching chamber.

19. The remote plasma system of claim 15, wherein the housing comprises beta-double aluminum oxide.

20. The remote plasma system of claim 15, wherein the plasma generating unit further comprises a magnetic coil around the plasma generating region.

* * * * *